(12) United States Patent
Park et al.

(10) Patent No.: US 7,636,251 B2
(45) Date of Patent: Dec. 22, 2009

(54) METHODS OF OPERATING A NON-VOLATILE MEMORY DEVICE

(75) Inventors: Yoon-dong Park, Yongin-si (KR);
Kyoung-lee Cho, Yongin-si (KR);
Jae-woong Hyun, Yongin-si (KR);
Sung-jae Byun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 174 days.

(21) Appl. No.: 11/826,059

(22) Filed: Jul. 12, 2007

(65) Prior Publication Data

US 2008/0013373 A1 Jan. 17, 2008

Related U.S. Application Data

(63) Continuation-in-part of application No. 11/723,018, filed on Mar. 15, 2007.

(30) Foreign Application Priority Data

Apr. 21, 2006 (KR) ............ 10-2006-0036408
Jul. 12, 2006 (KR) ............ 10-2006-0065469

(51) Int. Cl.
*G11C 11/00* (2006.01)

(52) U.S. Cl. ............ 365/148; 365/46; 365/100; 365/180

(58) Field of Classification Search ............ 365/148, 365/100, 46, 180
See application file for complete search history.

(56) References Cited

U.S. PATENT DOCUMENTS

| | | | |
|---|---|---|---|
| 6,570,788 B1 * | 5/2003 | Nakamura | 365/185.18 |
| 7,259,387 B2 * | 8/2007 | Kawazoe et al. | 257/2 |
| 2006/0006457 A1 * | 1/2006 | Ono | 257/316 |

* cited by examiner

*Primary Examiner*—Pho M. Luu
(74) *Attorney, Agent, or Firm*—Harness, Dickey & Pierce, P.L.C.

(57) ABSTRACT

A nonvolatile memory device may be operated in a multi-bit mode at a lower operating current and with higher integrated of the memory device. A first buried electrode may be used as a first bit line, a second buried electrode may be used as a second bit line, and/or a gate electrode may be used as a word line. First and second resistance layers may be programmed with 2-bit data and the 2-bit data may be read from the first and second resistance layers. More than 2-bit data may be programmed and read using more than 2 buried electrodes.

18 Claims, 5 Drawing Sheets

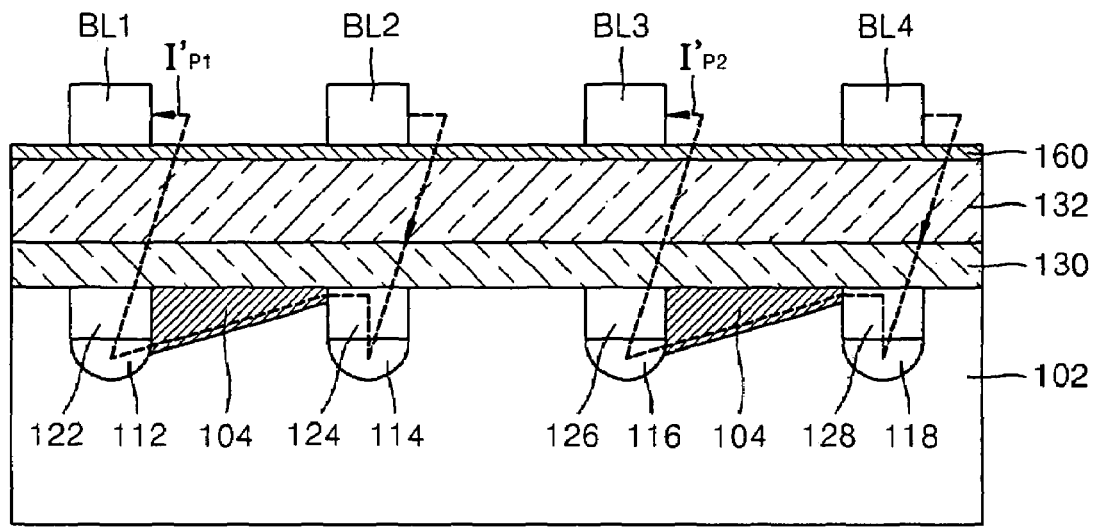
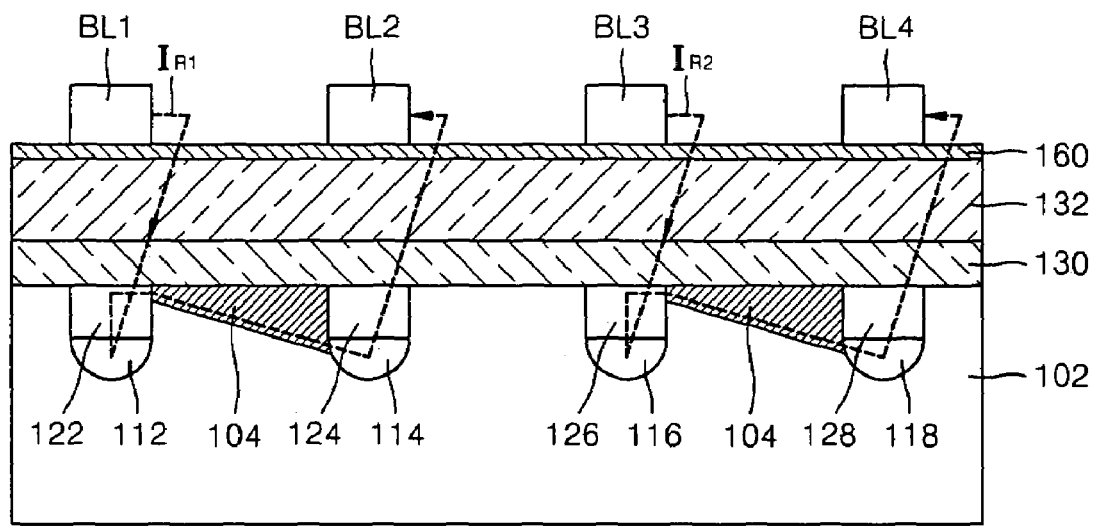

METHODS OF OPERATING A NON-VOLATILE MEMORY DEVICE

PRIORITY STATEMENT

This application is a continuation-in-part of U.S. patent application Ser. No. 11/723,018, filed on Mar. 15, 2007, now pending, which claims the benefit of priority under 35 USC § 119 to Korean Patent Application No. 10-2006-0036408, filed on Apr. 21, 2006 in the Korean Intellectual Property Office (KIPO), the disclosures of which are incorporated herein in their entirety by reference. This application also claims the benefit of priority under 35 USC § 119 to Korean Patent Application No. 10-2006-0065469, filed on Jul. 12, 2006 in the KIPO, the disclosure of which is incorporated herein in its entirety by reference.

BACKGROUND

1. Field

Example embodiments relate to a method of operating a semiconductor device, for example, to a method of operating a nonvolatile memory device using resistance nodes.

2. Description of the Related Art

A nonvolatile memory device, for example, a phase-change memory (PRAM) or a resistance memory (RRAM) may operate using variable resistance of resistance nodes. Because semiconductor products managing large quantities of data have increased capacity, the integration or the number of operating bits of nonvolatile memory devices may need to be increased. Nonvolatile memory devices that can operate in a multi-bit mode may be desirable for this integration.

Nonvolatile memory devices may have higher operating speeds as the capacity of the nonvolatile memory devices increases. Fast data processing may be required to manage large quantities of data. An increase in the operating speed of nonvolatile memory devices, for example, block erasing or flash erasing in flash memories, may be required for this data processing.

Because integration of nonvolatile memory devices may increase, attempts have been made to reduce the operating current. Nonvolatile memory devices using resistance nodes may need a higher operating current. A reduction in the operating current may affect variable resistance of resistance nodes. Related art nonvolatile memory devices may have limits in reducing the operating current.

For example, a phase change memory device may store data using variation in resistance according to the change of a crystal state of a phase change resistance element. To change the crystal state of a phase change memory device, higher current density may be required, and the operating current may increase. An increase in the operating current may generate a short channel effect, which may hinder integration of the phase change memory device. A region of the phase change resistance element in which the crystal state is changed may need to be reduced to obtain higher current density with a lower operating current.

SUMMARY

Example embodiments may provide a method of operating a nonvolatile memory device in a multi-bit mode, wherein the nonvolatile memory device may operate at a lower operating current and/or may be more integrated.

Example embodiments may provide a method of operating a nonvolatile memory device. A method of operating a nonvolatile memory device may include programming 2-bit data to first and second resistance layers and/or reading the 2-bit data programmed in the first and second resistance layers.

Programming the 2-bit data may include changing the resistance of the first and second resistance layers between two states.

Programming the 2-bit data may be performed by measuring the variation in the currents between the first bit line and the second bit line due to the variation in the resistance values of the first resistance layer and the second resistance layer.

Reading the 2-bit data may include forming a deep channel to connect one of the buried electrodes with one of the adjacent resistance layers and/or measuring sequentially two-way currents between the first bit line and the second bit line.

The method may include erasing the data stored in the first resistance layer and the second resistance layer at the same time.

Example embodiments may provided a method of operating a nonvolatile memory device, the nonvolatile memory device including a semiconductor substrate, a plurality of resistance layers that may be formed near a surface of the semiconductor substrate, each of which may store a variable resistance state, a plurality of buried electrodes that may be formed in the semiconductor substrate below the resistance layers and each connect the resistance layers, a gate electrode that may extend across the resistance layers, and/or a gate insulating layer between the semiconductor substrate and the gate electrode, wherein the buried electrodes may be used as a plurality of bit lines, and the gate electrode may be used as a word line. An example method of operating a nonvolatile memory device may include programming 2-bit data to two resistance layers that are adjacent and/or reading the 2-bit data programmed in the adjacent resistance layers.

BRIEF DESCRIPTION OF THE DRAWINGS

The above and/or other aspects and advantages will become more apparent from the following detailed description of example embodiments taken in conjunction with the accompanying drawings of which:

FIGS. 4 and 5 are cross-sectional views illustrating an example programming operation of an example nonvolatile memory device of FIG. 1;

FIGS. 6 and 7 are cross-sectional views illustrating an example reading operation of an example nonvolatile memory device of FIG. 1;

DETAILED DESCRIPTION OF EXAMPLE EMBODIMENTS

Figure 1:
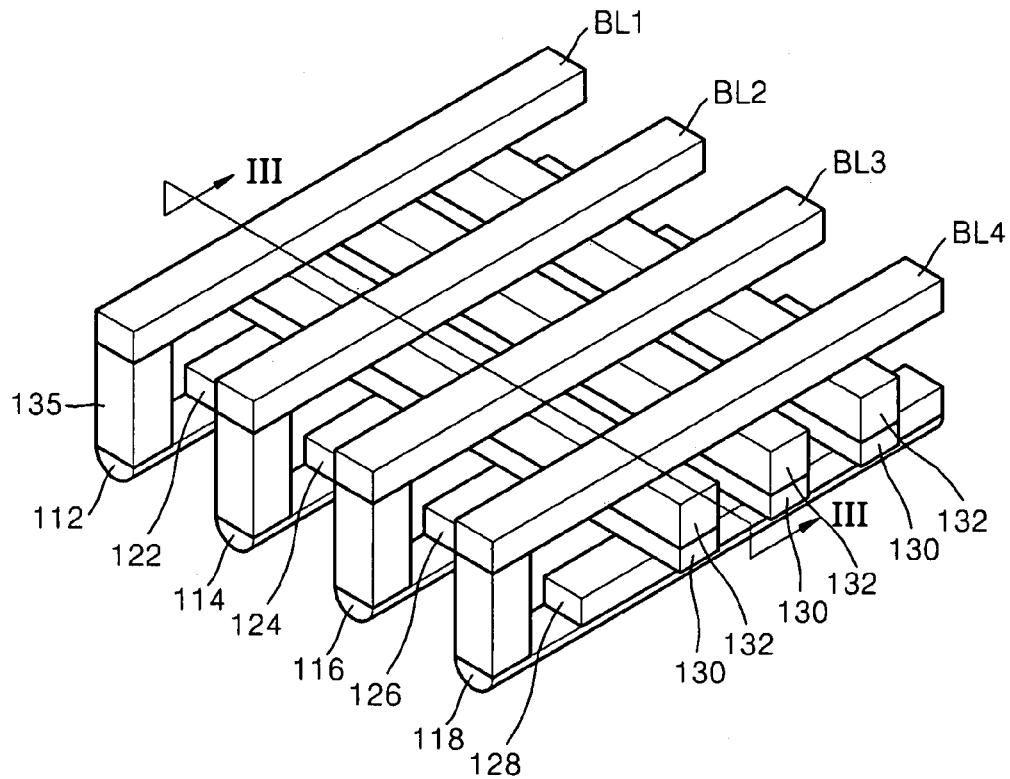
FIG. 1 is a perspective view of an example nonvolatile memory device.

Example embodiments will now be described more fully hereinafter with reference to the accompanying drawings.

Embodiments may, however, be in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

An example nonvolatile memory device may store data using a resistance node or a resistance layer. Example embodiment nonvolatile memory device may have various names depending on the type of the resistance node or the resistance layer. For example, an example nonvolatile memory device may be a phase change memory (PRAM) or a resistance memory (RRAM), but the claims may be embodied in several different ways.

Figure 2:
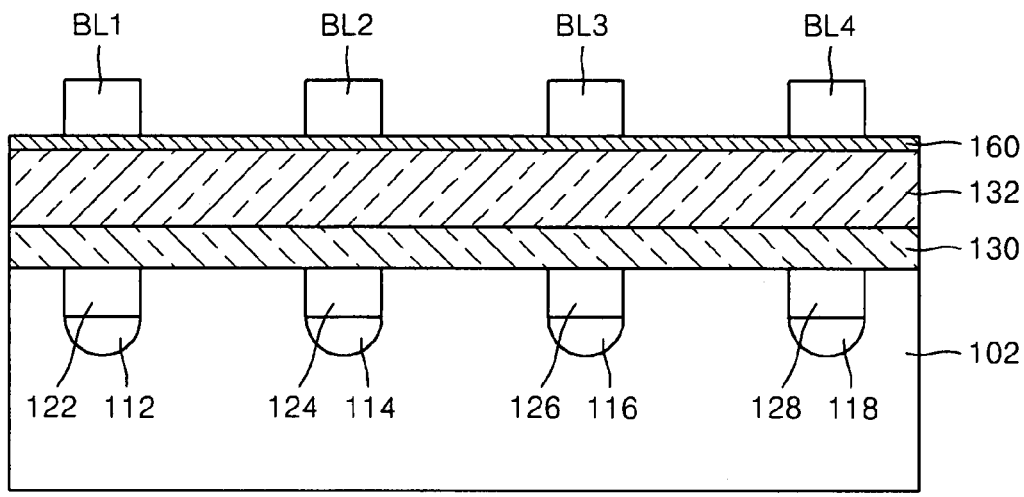
FIG. 2 is a cross-sectional view of an example nonvolatile memory device of FIG. 1 cut along a line III-III'.

FIG. 1 is a perspective view of an example nonvolatile memory device, and FIG. 2 is a cross-sectional view of an example nonvolatile memory device cut along a line III-III'.

As shown in FIGS. 1 and 2, a nonvolatile memory device may include a semiconductor substrate 102. The semiconductor substrate 102 is not illustrated in FIG. 1. The semiconductor substrate 102 may include a silicon (Si) wafer, a germanium (Ge) wafer, and/or a metal-insulator transition (MIT) material. The MIT material may include a transition metal oxide, for example, $V_2O_5$, $TiO_x$, or the any other suitable material. The MIT material may change into metal in an insulator if a voltage greater than a critical voltage is applied. The MIT material may be used for forming a multi-layered semiconductor device.

A plurality of resistance layers 122, 124, 126, and 128 may be formed near a surface of the semiconductor substrate 102. A plurality of buried electrodes 112, 114, 116, and 118 may be formed in the semiconductor substrate 102 under the resistance layers 122, 124, 126, and 128. A gate electrode 132 may be formed on the semiconductor substrate 102 and may extend across any or all the resistance layers 122, 124, 126, and 128. A gate insulating layer 130 may be between the semiconductor substrate 102 and the gate electrode 132. Bit lines BL1, BL2, BL3, and BL4 may be formed on the semiconductor substrate 102.

The buried electrodes 112, 114, 116, and 118 may have various names according to their function and/or arrangement, and the claims may be embodied by any of these various names. For example, the buried electrodes 112, 114, 116, and 118 may be called sequential source (S) and/or drain (D) electrodes or lower electrodes because of their position in the arrangement.

The buried electrodes 112, 114, 116, and 118 may be formed by doping impurities to the semiconductor substrate 102. If the semiconductor substrate 102 is doped with first conductive impurities, the buried electrodes 112, 114, 116, and 118 may be doped with second conductive impurities opposite in conductivity to the first conductive impurities. The buried electrodes 112, 114, 116, and 118 and the semiconductor substrate 102 may form a diode junction. The first and second conductive types may each be selected from n-type and p-type conductivities.

The buried electrodes 112, 114, 116, and 118 may include a metal layer and/or a metal silicide layer. The buried electrodes 112, 114, 116, and 118 may form a Schottky junction with the semiconductor substrate 102. The current flow between the buried electrodes 112, 114, 116, and 118 and the semiconductor substrate 102 may have rectifying characteristics.

The gate insulating layer 130 may insulate the gate electrode 132 from the semiconductor substrate 102. The gate insulating layer 130 may extend across the resistance layers 122, 124, 126, and/or 128 to insulate the resistance layers 122, 124, 126, and/or 128 from the gate electrode 132. The thickness of the gate insulating layer 130 may be selected according to the operating voltage and is not limited to the size illustrated in FIGS. 1 and 2. The gate electrode 132 may include a conductive material such as a polysilicon layer, a metal layer, and/or another suitable material.

The bit lines BL1, BL2, BL3, and BL4 may be formed on the gate electrode 132 by interposing an interlayer insulating layer 160. The bit lines BL1, BL2, BL3, and BL4 may be connected to the buried electrodes 112, 114, 116, and 118 through plugs 135. The bit lines BL1, BL2, BL3, and BL4 may extend in a different direction than the gate electrode 132, for example, in a direction parallel to the buried electrodes 112, 114, 116, and 118. The bit lines BL1, BL2, BL3, and BL4 may include a metal layer.

The resistance layers 122, 124, 126, and 128 may store a variable resistance state, and the variable resistance state may correspond to a data state. For example, the resistance layers 122, 124, 126, and 128 may have a lower resistance state and/or a higher resistance state, and the lower resistance state and/or the higher resistance state may correspond to the data states "0" or "1". If any resistance layers are combined, a data state of 2 bits or more may be produced. For example, if two resistance layers are combined, 2-bit data states of (0, 0), (0,1), (1, 0), and/or (1, 1) may be produced.

The resistance layers 122, 124, 126, and 128 may include a material, the resistance of which changes due to a voltage applied to the resistance layers 122, 124, 126, and 128, and may include $Nb_2O_5$, Cr-doped $SrTiO_3$, $ZrO_x$, GST($GeSb_x$-$Te_y$), NiO, ZnO, $TiO_2$, HfO, and/or any other suitable material. GST may be used in a PRAM because the resistance of GST changes with the crystal state of GST. Also, $Nb_2O_5$, Cr-doped $SrTiO_3$, NiO and/or ZnO can be used in a RRAM because the resistance of these materials changes despite change in a crystal state of these materials.

Figure 3:
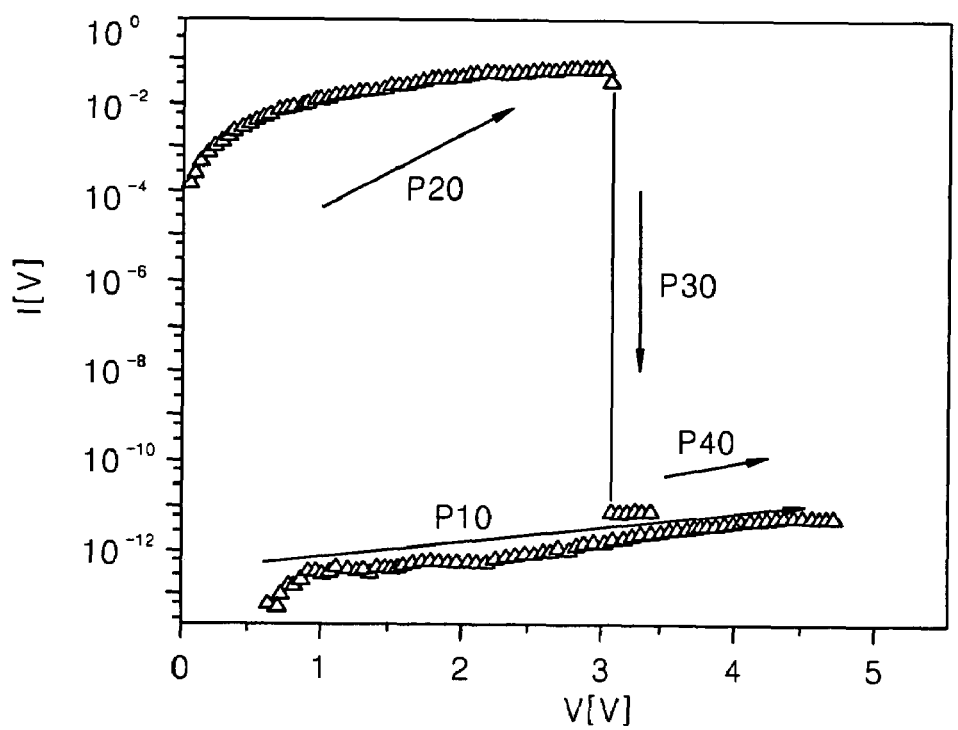
FIG. 3 is a graph showing a voltage-current characteristic of a resistance layer of an example nonvolatile memory device.

FIG. 3 is a graph showing characteristic voltage-current of a resistance layer of an example embodiment. A resistance layer of an example RRAM may include NiO, but other materials may be used, in which case a characteristic voltage-current may be different. Irrespective of the material, the resistance of the resistance layer may change due to the applied voltage.

As shown in FIG. 3, if an initial voltage is applied to the resistance layer (P10), a lower current may flow up to a set voltage, for example, to about 4.5 V in the case of NiO. Here, the resistance layer first may have higher resistance as in a reset state. The current may increase if the voltage of resistance layer exceeds the set voltage. If a voltage greater than the set voltage is applied and a voltage from 0 is applied again (P20), a larger current may flow. Here, the resistance layer may have lower resistance as in a set state. If the voltage increases to a voltage greater than a reset voltage, the current may be reduced (P30). Here, the resistance of the resistance layer may be set to a higher resistance of the reset state. If the voltage is continuously increased upon reaching the set voltage (P40), the resistance layer may repeat the cycle from the initial reset state.

The resistivity of the resistance layer may change at the boundary of a critical voltage, for example, a set voltage and/or a reset voltage, and the change in the resistivity may be retained in a range of voltage after the applied voltage disappears. The resistance layer may be used as a storage medium of a volatile memory device.

FIG. 3 is related to an example RRAM, and a resistance layer used in a PRAM may experience different resistance changes. The resistance layer used in a PRAM may be called a phase change resistance element, and the resistance state of the phase change resistance element may change through transition to an amorphous state and a crystal state. Because the resistance change characteristic of such a phase change resistance element is known in the related art, a detailed description thereof will be omitted.

In example embodiments, any two of the resistance layers 122, 124, 126, and/or 128, for example, a first resistance layer 122 and a second resistance layer 124 may form a unit cell structure. A first buried electrode 112, a second buried electrode 114, a first bit line BL1, and/or a second bit line BL2 may form a portion of a unit cell structure.

Example nonvolatile memory devices are not limited to the arrangement of FIGS. 1 and 2. Example nonvolatile memory devices may include a unit cell structure or a plurality of unit cell structures. The resistance layers 122, 124, 126, and 128, the buried electrodes 112, 114, 116, and 118, and/or the bit lines BL1, BL2, BL3, and BL4 may be provided in pairs, and example embodiments are not limited to any particular number of these components.

Hereinafter, the operating characteristics of an example nonvolatile memory device will be described.

Figure 4:
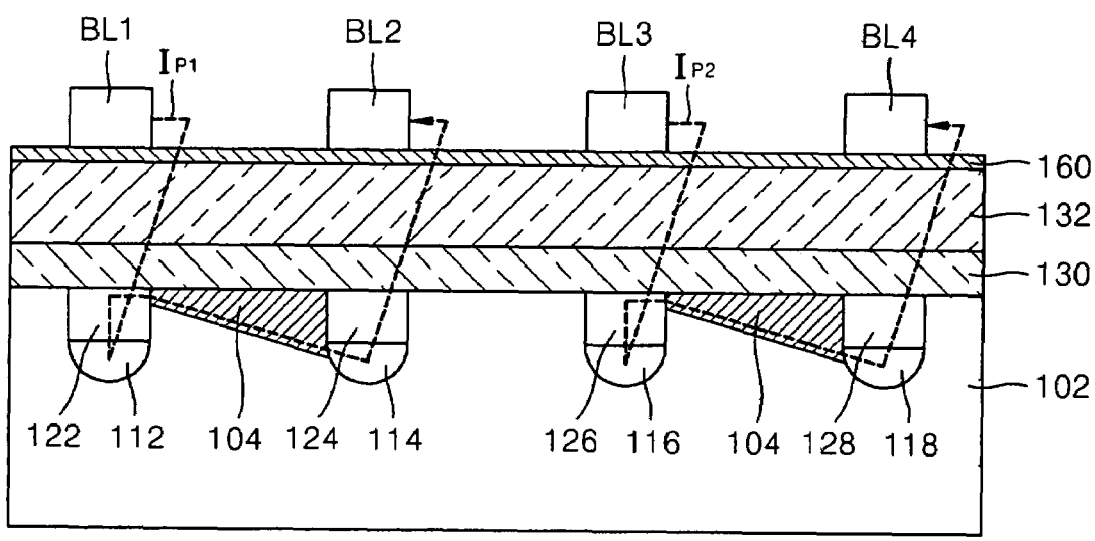

FIGS. 4 and 5 are cross-sectional views illustrating an example programming operation of an example nonvolatile memory device of FIG. 1.

As shown in FIGS. 4 and 5, the first resistance layer 122 and the second resistance layer 124 may form a unit cell, and/or the third resistance layer 126 and the fourth resistance layer 128 may form another unit cell. FIGS. 4 and 5 illustrate two unit cells operating at the same time, but the two unit cells may also operate separately. The arrangement of the unit cells may be different. For example, the second resistance layer 124 and the third resistance layer 126 may form a unit cell. The gate electrode 132 may be used as a word line.

FIG. 4 illustrates an example programming operation of two resistance layers from two unit cells, for example, the first resistance layer 122 and the third resistance layer 126. Data may be stored in a right portion of the first resistance layer 122 and in a right portion of the third resistance layer 126. Example data programming may be performed by changing the resistance of the first and third resistance layers 122 and 126 between two states.

For example, a programming voltage may be applied to the first bit line BL1, and a turn-on voltage may be applied to the word line embodied by gate electrode 132, so that a deep channel 104 may be formed to connect the second buried electrode 114 and the first resistance layer 122. The deep channel 104 may be deeper around the second bit line BL 2 than around the first bit line BL1. The depth of the deep channel 104 may be controlled by the turn-on voltage applied to the gate electrode 132 and/or the concentration of impurities of the semiconductor substrate 102.

A programming current $I_{P1}$ may flow from the first bit line BL1 through the first buried electrode 112, the first resistance layer 122, the deep channel 104, and/or the second buried electrode 114 toward the second bit line BL2, due to the relative conductivity of these structures. Because the deep channel 104 may connect the first resistance layer 122 and the second buried electrode 114, the amount of the programming current $I_{P1}$ passing the second resistance layer 124, which may have a greater resistance, may be negligible.

A programming voltage may be applied to the third bit line BL3, and a turn-on voltage may be applied to the word line embodied by gate electrode 132 to form deep channel 104 connecting the fourth buried electrode 118 and the third resistance layer 126. A programming current $I_{P2}$ may flow from the third bit line BL3, through the third buried electrode 116, the third resistance layer 126, the deep channel 104, and/or the fourth buried electrode 118 to the fourth bit line BL4.

A programming current may flow to the first resistance layer 122 and the third resistance layer 126, and the resistance of the first resistance layer 122 and the third resistance layer 126 may change. For example, if a lower resistance state before programming is "0", the first resistance layer 122 and the third resistance layer 126 may be in a higher resistance state of "1". The programming voltage may be a voltage to make the phase change resistance element amorphous. Data states "0" and "1" may be denoted the other way around.

The two unit cells may be converted from (0,0) to (1,0) by the programming operation of FIG. 4. For example, (0,0) may denote that the two resistance layer in the unit cells, for example, the first and second resistance layers 122 and 124 or the third and fourth resistance layers 126 and 128, are all in a lower resistance state. (1,0) may denote that the left resistance layer in the unit cell, for example, the first resistance layer 122 and/or the third resistance layer 126 are in a higher resistance state and that the right resistance layer, for example, the second resistance layer 124 and/or the fourth resistance layer 128, are in a lower resistance state.

FIG. 5 illustrates different resistance layers selected from the two unit cells for an example programming operation of the second resistance layer 124 and the fourth resistance layer 128. Data may be stored in a left portion of the second resistance layer 124 and/or in a left portion of the fourth resistance layer 128. The programming operation of FIG. 5 may be performed by changing the direction of current in the programming operation of FIG. 4.

For example, a programming voltage may be applied to the second and fourth bit lines BL2 and BL4, and a turn-on voltage may be applied to the word line embodied by gate electrode 132 to form a deep channel 104 connecting the third buried electrode 116 and the fourth resistance layer 128.

A programming current $I'_{P1}$ may flow from the second bit line BL2 to the first bit line BL1, and/or a programming current $I'_{P2}$ may flow from the fourth bit line BL4 to the third bit line BL3. A programming current may flow through the second resistance layer 124 and/or the fourth resistance layer 128, and the resistance of the second resistance layer 124 and/or the fourth resistance layer 128 may change.

The two unit cells may be converted from (0,0) to (0,1) by the programming operation of FIG. 5. (0,1) may denote that the right resistance layer in the unit cell, for example, the second resistance layer 124 and/or the fourth resistance layer 128, are in a higher resistance state and/or that the left resistance layer, for example, the first resistance layer 122 and/or the third resistance layer 126, are in a lower resistance state.

If example programming operations of FIGS. 4 and 5 are sequentially performed on the two unit cells, the two unit cells may be converted first from (0,0) to (1,0) and then to (1,1). (1,1) may denote that the two resistances in the unit cells, for example, the first and second resistance layers 122 and 124 and/or the third and fourth resistance layers 126 and 128 are all in a higher resistance state. Using example programming operations of FIG. 4 and/or FIG. 5, the unit cells may have respectively four data states: (0, 0), (1, 0), (0, 1), and (1, 1), and may store 2-bit data.

In example programming operation described above, the resistance change region of the resistance layers 122, 124, 126, and 128 may be a portion contacting the deep channel 104. The programming operation may be performed using a lower programming current $I_{P1}$, $I_{P2}$, $I'_{P1}$, or $I'_{P2}$.

Figure 7:
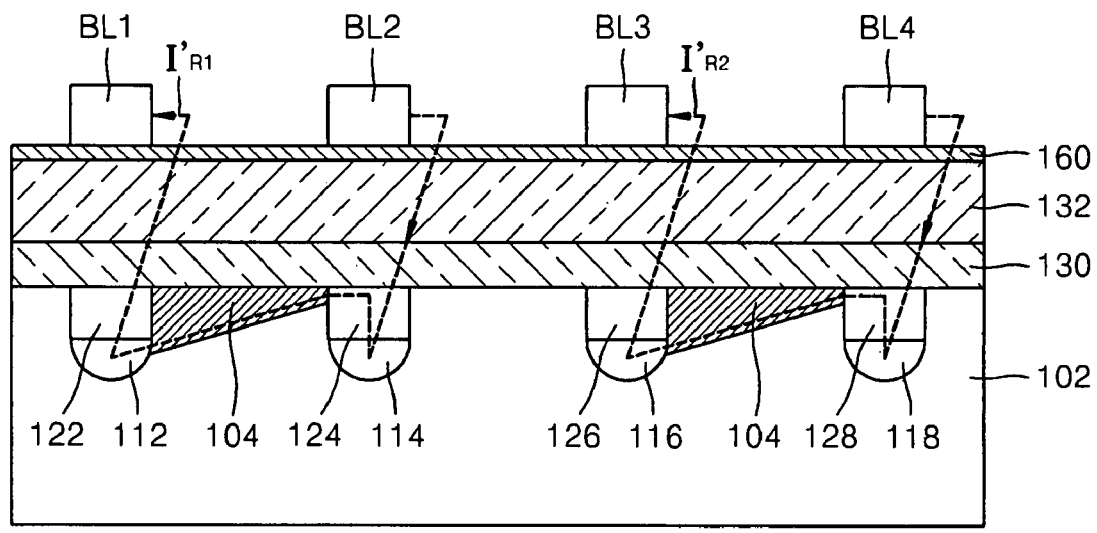

FIGS. 6 and 7 are cross-sectional views illustrating an example reading operation of an example nonvolatile memory device of FIG. 1.

Referring to FIG. 6, a reading voltage may be applied to the first and third bit lines BL1 and BL3, and a turn-on voltage may be applied to the word line embodied by gate electrode 132 to form a deep channel 104 connecting the second buried electrode 114 and the first resistance layer 122, and/or the fourth buried electrode 118 and the third resistance layer 126. The reading voltage may be a lower voltage so as not to cause resistance change and may be smaller than the programming voltage.

A reading current $I_{R1}$ may flow from the first bit line BL1, through the first buried electrode 112, the first resistance layer 122, the deep channel 104, and/or the second buried electrode 114 toward the second bit line BL2. A reading current $I_{R2}$ may flow from the third bit line BL3, through the third buried electrode 116, the third resistance layer 126, the deep channel 104, and/or the fourth buried electrode 118 toward the fourth bit line BL4.

Resistance of the first resistance layer 122 and/or the third resistance layer 126 may be calculated from the level of the reading currents $I_{R1}$ and $I_{R2}$. As described above, the reading current $I_{R1}$, an/or $I_{R2}$ may flow relatively little to the second resistance layer 124 and the fourth resistance layer 128, and the resistance of the first resistance layer 122 and the third resistance layer 126 may be calculated. Accordingly, the data state, "0" and/or "1" of the first resistance layer 122 and the third resistance layer 126 may be read.

As shown in FIG. 7, a reading voltage may be applied to the second and/or fourth bit lines BL2 and BL4, and a turn-on voltage may be applied to the word line embodied as the gate electrode 132, to form a deep channel 104 connecting the first buried electrode 112 and the second resistance layer 124, and/or the third buried electrode 116 and the fourth resistance layer 128.

A reading current $I'_{R1}$ may flow from the second bit line BL2, through the second buried electrode 114, the second resistance layer 124, the deep channel 104, and/or the first buried electrode 112 toward the first bit line BL1. A reading current $I'_{R2}$ may flow from the fourth bit line BL4, through the fourth buried electrode 118, the fourth resistance layer 128, the deep channel 104, and/or the third buried electrode 116 toward the third bit line BL3. Resistance of the second resistance layer 124 and/or the fourth resistance layer 128 may be calculated from the reading current $I'_{R1}$ and/or $I'_{R2}$. The data state "0" and/or "1" of each of the second resistance layer 124 and the fourth resistance layer 128 may be read.

As illustrated in FIGS. 6 and 7, 2-bit data programmed in the first resistance layer 122 and the second resistance layer 124 of the unit cell may be read by forming a deep channel 104 and measuring two-way currents between the first bit line BL1 and the second bit line BL2. 2-bit data programmed in the third resistance layer 126 and the fourth resistance layer 128 can be read by forming a deep channel 104 and measuring two-way currents $I_{R2}$, and $I'_{R2}$ between the third bit line BL3 and the fourth bit line BL4.

Figure 8:
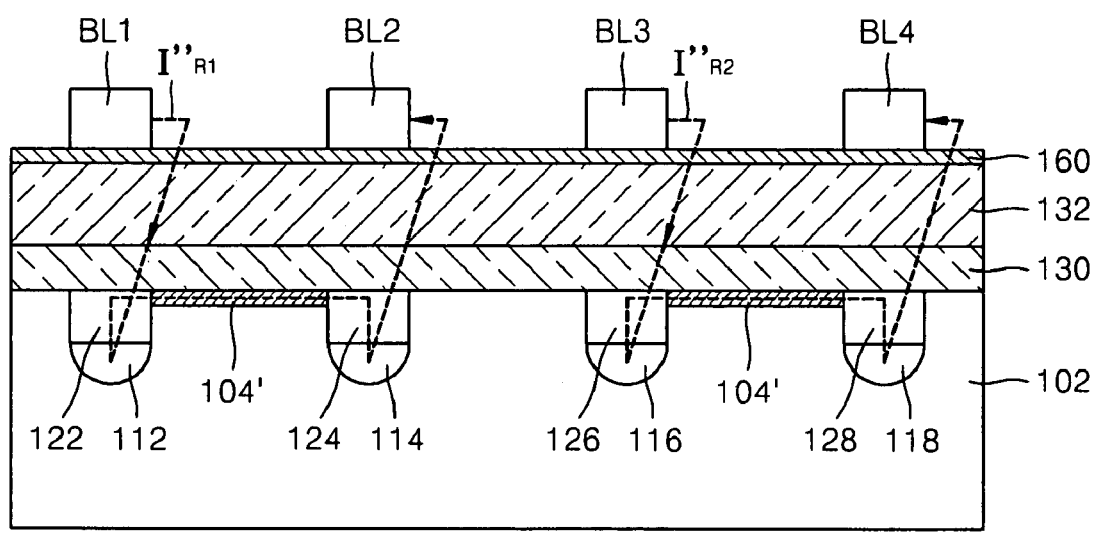
FIG. 8 is a cross-sectional view illustrating an example reading operation of an example nonvolatile memory device of FIG. 1.

FIG. 8 is a cross-sectional view illustrating an example reading operation of an example nonvolatile memory device of FIG. 1.

As shown in FIG. 8, a reading voltage may be applied to the first bit line BL1, and a shallow channel 104' may be formed in the semiconductor substrate 102 to connect the first resistance layer 122 and the second resistance layer 124. Thus, a reading current $I''_{R1}$ may flow from the first bit line BL1, a first buried electrode 112, the first resistance layer 122, the shallow channel 104', the second resistance layer 124, and/or the second buried electrode 114 toward the second bit line BL2. The shallow channel 104' may be formed at depth that may directly connect the first and second resistance layers 122 and 124 and not the first and second buried electrodes 112 and 114. The shallow channel 104' may be formed by increasing the turn-on voltage applied to the word line embodied by the gate electrode 132.

A reading voltage may be applied to the third bit line BL3, and another shallow channel 104' may be formed in the semiconductor substrate 102 to connect the third resistance layer 126 and the fourth resistance layer 128. A reading current $I''_{R2}$ may flow from the third bit line BL3, through the third buried electrode 116, the third resistance layer 126, the shallow channel 104', the fourth resistance layer 128, and/or the fourth buried electrode 118 toward the fourth bit line BL4.

By measuring the reading current $I''_{R1}$, the resistance and data state of the first resistance layer 122 and/or the second resistance layer 124 may be calculated at the same time, and the resistance and data state of the third resistance layer 126 and the fourth resistance layer 128 may be calculated at the same time by measuring the reading current I"$_{R2}$. Because the reading current I"$_{R1}$ may be changed according to the resistance of the first resistance layer 122 and the second resistance layer 124, and because the reading current I"$_{R2}$ may be changed according to the resistance of the third resistance layer 126 and the fourth resistance layer 128, resistances of the resistance layers may be calculated.

The difference between the reading currents I"$_{R1}$ and I"$_{R2}$ may be caused because a threshold voltage to form the shallow channels 104' may depend on the potential of the source of the semiconductor substrate 102. The source may be an end portion of the second buried electrode 114 and/or the second resistance layer 124, or an end portion of the fourth buried electrode 118 and/or the fourth resistance layer 128. The potential of the source may vary according to the resistance of the first resistance layer 122 and the second resistance layer 124 and/or according to the resistance of the third resistance layer 126 and the fourth resistance layer 128.

Figure 10:
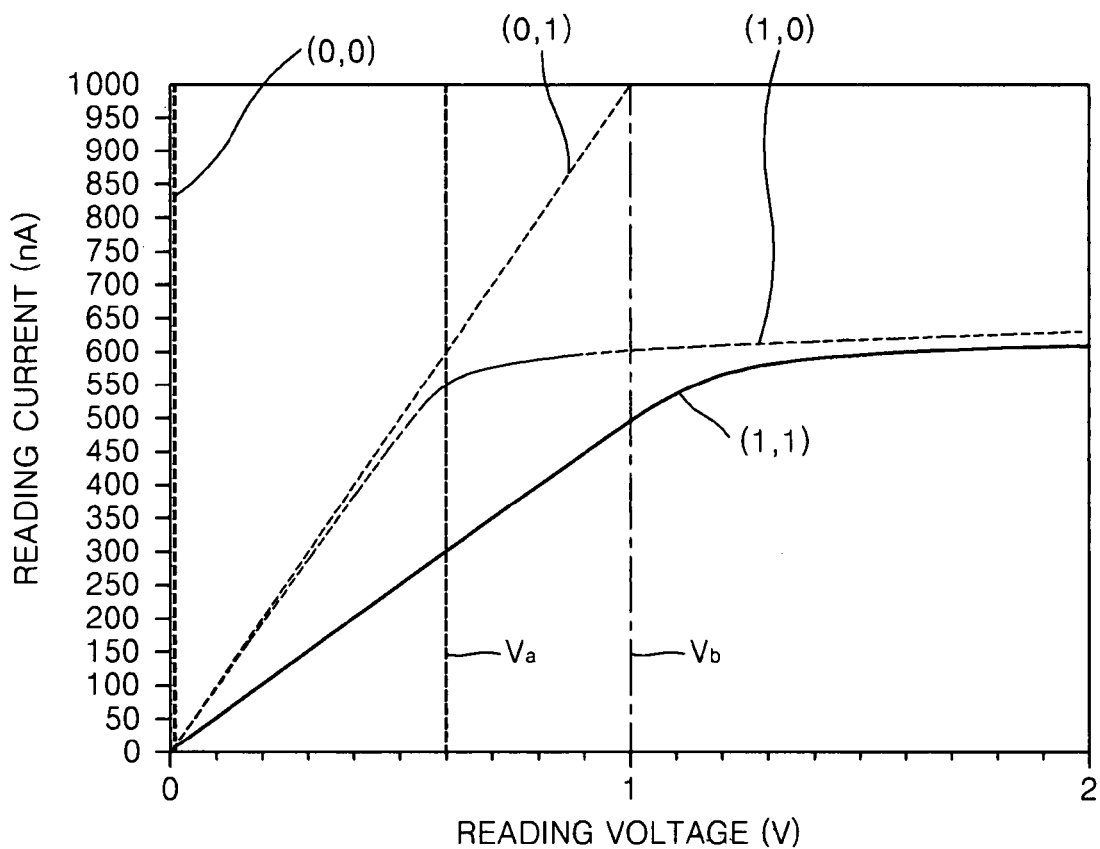
FIG. 10 is a graph showing a simulated result of an example reading operation of an example nonvolatile memory device of FIG. 1, illustrated in FIG. 8.

FIG. 10 illustrates results of an example reading operation of an example nonvolatile memory device of FIG. 1. In this example, the resistance of the resistance layer 122, 124, 126, and 128 at "0" may be about 1 kΩ and the resistance at "1" may be about 1 MΩ.

As shown in FIG. 10, if the reading voltage is V$_b$, the reading current of the data states (1, 1), (1, 0), (0, 1), and (0, 0) may increase in a sequence. In order to distinguish the data states (1, 0) and (1, 1), the reading current may be compared to a reading current at V$_a$. For example, V$_a$ may be about 0.6 V, and V$_b$ may be about 1 V. By comparing one or two reading currents, the data state of the resistance layers of unit cells may be read. For example, the data state may be calculated by comparing the value of the measured reading current and a reading current of a previously known data state.

Figure 9:
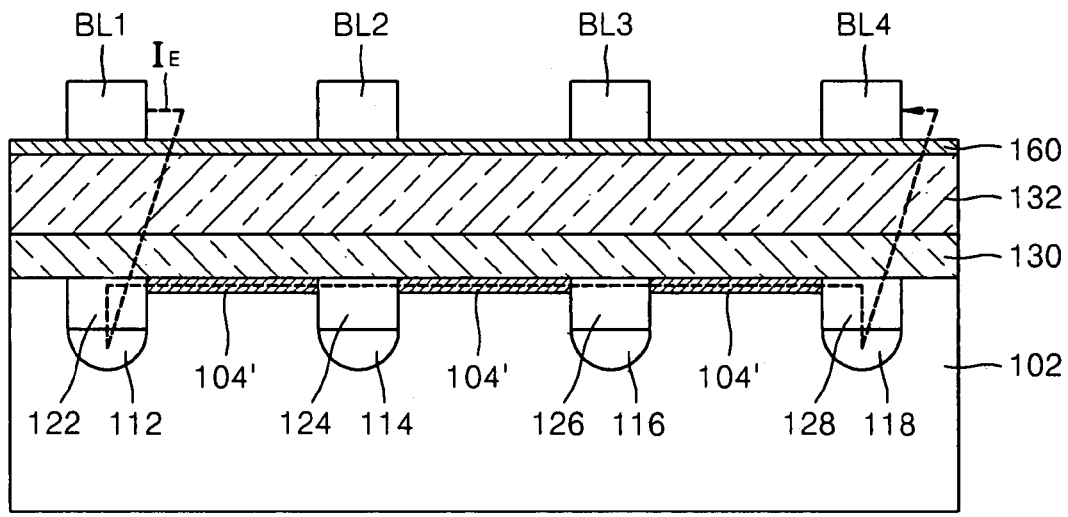
FIG. 9 is a cross-sectional view illustrating an example erasing operation of an example nonvolatile memory device of FIG. 1.

FIG. 9 is a cross-sectional view illustrating an example erasing operation of an example nonvolatile memory device of FIG. 1.

As shown in FIG. 9, data stored in resistance layers, for example, data of the first through fourth resistance layers 122, 124, 126, and 128 may be erased at the same time. Such an erasing operation may be called block erasing and/or flash erasing.

For example, a shallow channel 104' may be formed to connect the first through fourth resistance layers 122, 124, 126, and 128, and an erasing voltage may be applied between outermost bit lines of the first through fourth resistance layers 122, 124, 126, and 128. An erasing current may flow from the first bit line BL1 through the first through fourth resistance layers 122, 124, 126, and 128, to the fourth bit line BL4.

Data stored in the first through fourth resistance layers 122, 124, 126, and 128 may be erased by the erasing current at the same time. For example, the resistance of the first through fourth resistance layers 122, 124, 126, and 128 may be changed to a lower resistance, and all of the data states may be changed to "0". The erasing voltage may be changed according to the number of selected first through fourth resistance layers 122, 124, 126, and 128.

In example embodiments, the data of the first through fourth resistance layers 122, 124, 126, and 128 may be erased simultaneously, thereby obtaining a higher erasing speed.

Although example embodiments have been described above in conjunction with 2-bit data, the teachings of example embodiments may be applied to N-bit data, where N>2.

While example embodiments have been particularly shown and described with reference, it will be understood by those of ordinary skill in the art that various changes in form and details may be made therein without departing from the spirit and scope of the following claims.

What is claimed is:

1. A method of operating a nonvolatile memory device comprising:
   programming at least 2-bit data as a variable resistance state of a first resistance layer and a second resistance layer, the first and the second resistance layers being adjacent and near a surface of a semiconductor substrate;
   reading at least 2-bit data from the variable resistance state of the first resistance layer and the second resistance layer;
   using a first buried electrode as a first bit line and a second buried electrode as a second bit line; and
   using a gate electrode as a word line.

2. The method of claim 1, wherein programming the 2-bit data includes changing the resistance of the first and second resistance layers by changing a resistance state of the first and second resistance layers.

3. The method of claim 2, wherein programming the 2-bit data includes changing the resistance of the first resistance layer with a programming voltage applied to the first bit line and applying a turn-on voltage to the word line to form a deep current path electrically connecting the second buried electrode and the first resistance layer.

4. The method of claim 2, wherein programming the 2-bit data includes changing the resistance of the second resistance layer with a programming voltage applied to the second bit line and applying a turn-on voltage to the word line to form a deep current path electrically connecting the first buried electrode and the second resistance layer.

5. The method of claim 1, wherein reading the 2-bit data includes forming a deep current path to electrically connect one of the first and second buried electrodes with one of the second and first resistance layers and sequentially measuring a plurality of two-way currents between the first bit line and the second bit line.

6. The method of claim 1, wherein reading the 2-bit data includes forming a shallow current path to electrically connect the first resistance layer and the second resistance layer and measuring at least one one-way current between the first bit line and the second bit line.

7. The method of claim 6, wherein measuring the at least one one-way current is repeated using a plurality of levels of a reading voltage.

8. The method of claim 1, further comprising:
   erasing the 2-bit data stored in the first resistance layer and the second resistance layer at the same time.

9. The method of claim 8, wherein erasing the data includes forming a shallow current path to electrically connect the first resistance layer and the second resistance layer and applying an erasing voltage between the first bit line and the second bit line.

10. The method of claim 1, wherein the first and second resistance layers include at least one of Nb$_2$O$_5$, Cr-doped SiTiO$_3$, ZrO$_x$, GST(GeSb$_x$Te$_y$), NiO, ZnO, TiO$_2$, and HfO.

11. A method of operating a nonvolatile memory device comprising:
   programming at least 3-bit data as a variable resistance state of at least three adjacent resistance layers of at least three resistance layers near a surface of a semiconductor substrate,
   reading at least 3-bit data from the variable resistance state of the at least three adjacent resistance layers of the at least three resistance layers, using at least three buried electrodes as at least three bit lines; and using a gate electrode as a word line.

12. The method of claim 11, wherein programming the at least 3-bit data includes changing the resistance of the at least three adjacent resistance layers by changing a state of the at least three adjacent resistance layers.

13. The method of claim 12, wherein programming the at least 3-bit data includes forming a deep current path electrically connecting one of the at least three adjacent resistance layers with one of the at least three buried electrodes and applying a programming voltage to the one buried electrode.

14. The method of claim 12, wherein reading the at least 3-bit data includes forming a deep current path electrically connecting one of the at least three adjacent resistance layers with one the at least three of buried electrodes and sequentially measuring at least three two-way currents between bit lines connected to the at least three adjacent resistance layers.

15. The method of claim 12, wherein reading the at least 3-bit data includes forming a shallow current path electrically connecting the at least three adjacent resistance layers and measuring a one-way current between the bit lines connected to the at least three adjacent resistance layers.

16. The method of claim 15, wherein measuring the one-way current is repeated using at least three levels of a reading voltage.

17. The method of claim 11, further comprising:
erasing the at least 3-bit data stored in a plurality of consecutive resistance layers of the at least three resistance layers at the same time.

18. The method of claim 17, wherein erasing the at least 3-bit data includes forming a shallow charge path electrically connecting the at least three consecutive resistance layers and applying an erasing voltage to at least three bit lines connected to the at least three resistance layers at both ends of the at least three consecutive resistance layers.

* * * * *